United States Patent
Im et al.

(10) Patent No.: US 12,301,742 B2
(45) Date of Patent: May 13, 2025

(54) ELECTRONIC DEVICE INCLUDING METAL MEMBER

(71) Applicant: SAMSUNG ELECTRONICS CO., LTD., Suwon-si (KR)

(72) Inventors: Junghyun Im, Suwon-si (KR); Joungki Park, Suwon-si (KR); Jinwoo Park, Suwon-si (KR); Seungchang Baek, Suwon-si (KR); Yoonhee Lee, Suwon-si (KR); Jungwoo Choi, Suwon-si (KR); Sungho Cho, Suwon-si (KR); Hangyu Hwang, Suwon-si (KR); Jongchul Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 18/120,021

(22) Filed: Mar. 10, 2023

(65) Prior Publication Data

US 2023/0216942 A1     Jul. 6, 2023

Related U.S. Application Data

(63) Continuation of application No. PCT/KR2022/013277, filed on Sep. 5, 2022.

(30) Foreign Application Priority Data

Oct. 19, 2021  (KR) .................. 10-2021-0139566
Nov. 17, 2021  (KR) .................. 10-2021-0158657

(51) Int. Cl.
*H04M 1/00*  (2006.01)
*H04M 1/02*  (2006.01)

(52) U.S. Cl.
CPC ....... *H04M 1/0249* (2013.01); *H04M 1/0274* (2013.01); *H04M 1/0277* (2013.01)

(58) Field of Classification Search
CPC . H04M 1/0249; H04M 1/0274; H04M 1/0277
(Continued)

(56) References Cited

U.S. PATENT DOCUMENTS 6,341,227 B1 *  1/2002  Moster ................. H04B 1/3833
                                                      455/575.1
8,772,650 B2     7/2014  Merz et al.
(Continued)

FOREIGN PATENT DOCUMENTS

KR  10-1994-0013671   7/1994
KR  10-2013-0116310   10/2013
(Continued)

OTHER PUBLICATIONS

Extended European Search Report dated Nov. 8, 2024 issued in European Patent Application No. 22883769.6.
(Continued)

*Primary Examiner* — Zhengfu J Feng
(74) *Attorney, Agent, or Firm* — Nixon & Vanderhye, P.C.

(57) ABSTRACT

An electronic device according to an embodiment may include a housing comprising: an outer portion defining at least a portion of an exterior of the electronic device and comprising a first conductive material, an inner portion comprising a second conductive material having a first melting point different from that of the first conductive material and at least partially defining a space for receiving multiple electronic components arranged inside the electronic device, and a middle portion comprising a third conductive material having a second melting point and an injection molded insulator, wherein the third conductive material of the middle portion and the first conductive material of the outer portion are coupled to form a concave-convex structure, a difference between the first melting point
(Continued)

and the second melting point is in a first range, and the third conductive material of the middle portion is electrically connected to the second conductive material of the inner portion.

20 Claims, 11 Drawing Sheets

(58) Field of Classification Search
USPC .................................................. 361/679.01
See application file for complete search history.

(56) References Cited

U.S. PATENT DOCUMENTS

| | | | | |
|---|---|---|---|---|
| 8,885,333 | B2* | 11/2014 | Lim | H04M 1/0283 361/679.55 |
| 10,159,156 | B2* | 12/2018 | Seo | H05K 5/10 |
| 10,285,295 | B2* | 5/2019 | Kiple | H05K 5/04 |
| 10,432,768 | B2 | 10/2019 | Choi et al. | |
| 10,778,819 | B2 | 9/2020 | Kim et al. | |
| 11,159,660 | B2 | 10/2021 | Choi et al. | |
| 11,463,570 | B2 | 10/2022 | Yoo et al. | |
| 2007/0123078 | A1* | 5/2007 | Yada | H05K 1/028 439/164 |
| 2015/0334211 | A1* | 11/2015 | Shin | G06F 1/1637 455/566 |
| 2016/0008878 | A1 | 1/2016 | Liu et al. | |
| 2016/0048288 | A1* | 2/2016 | Lee | G06F 3/04883 455/566 |
| 2016/0088130 | A1* | 3/2016 | Jung | G06F 1/1626 455/575.1 |
| 2016/0165027 | A1* | 6/2016 | Hahn | G06F 3/04164 455/566 |
| 2019/0217513 | A1* | 7/2019 | Bustle | B29C 45/14786 |
| 2019/0222683 | A1* | 7/2019 | Choi | H05K 5/0086 |
| 2020/0092408 | A1* | 3/2020 | Moon | H04M 1/0266 |
| 2020/0252492 | A1 | 8/2020 | Choi et al. | |
| 2020/0288593 | A1 | 9/2020 | Hooton et al. | |

FOREIGN PATENT DOCUMENTS

| | | |
|---|---|---|
| KR | 10-2019-0087140 | 7/2019 |
| KR | 10-2019-0097553 | 8/2019 |
| KR | 10-2020-0022161 | 3/2020 |
| KR | 10-2020-0094950 | 8/2020 |
| KR | 10-2021-0092166 | 7/2021 |

OTHER PUBLICATIONS

International Search Report for PCT/KR2022/013277 mailed Dec. 16, 2022, 8 pages.
Written Opinion of the ISA for PCT/KR2022/013277 mailed Dec. 16, 2022, 3 pages.

* cited by examiner

ELECTRONIC DEVICE INCLUDING METAL MEMBER

CROSS-REFERENCE TO RELATED APPLICATIONS

This application is a continuation of International Application No. PCT/KR2022/013277 designating the United States, filed on Sep. 5, 2022, in the Korean Intellectual Property Receiving Office and claiming priority to Korean Patent Application No. 10-2021-0139566, filed on Oct. 19, 2021, in the Korean Intellectual Property Office, and to Korean Patent Application No. 10-2021-0158657, filed on Nov. 17, 2021, in the Korean Intellectual Property Office, the disclosures of all of which are incorporated by reference herein in their entireties.

BACKGROUND

Field

The disclosure relates to an electronic device including a metal member.

Description of Related Art

An electronic device such as a smartphone may include a housing which forms the exterior of the electronic device. The housing of the electronic device may be commonly made of a metal or plastic material. For example, a part of the housing may be made of a metal member to protect the exterior of the electronic device, and another part of the housing may be made of a plastic member to reduce weight and to facilitate manufacturing.

In addition, the housing of the electronic device may include a metal material so as to implement an aesthetic appearance, and may include a plastic material such that the metal material part may be partially used as an antenna of the electronic device.

In general, an electronic device may include an exterior housing made of a metal material having a higher specific gravity or density, such as titanium or steel use stainless (SUS), than normal metal materials. If such a metal material having a higher specific gravity or density is used, the amount of raw material used per the same volume may increase, and the cost for manufacturing the electronic device may increase.

In addition, the metal material such as titanium or stainless steel has a higher specific gravity or density than other metal materials and may thus increase the weight of the electronic device, and is difficult to process, thereby increasing the time and cost to fabricate the housing.

In addition, the electronic device may include a housing which has a heterojunction of a metal having a high specific gravity or density (for example, titanium or stainless steel) and a metal having a low specific gravity or density (for example, magnesium or aluminum). However, the housing having a heterojunction may be difficult to obtain by a method such as welding due to a difference in melting point between the metal materials, and the junction surface may widen or bend due to a difference in thermal expansion coefficient when the housing is fabricated by a diecasting process.

SUMMARY

Embodiments of the disclosure may provide a lightweight electronic device and may provide an electronic device which can be manufactured with reduced cost and time.

An electronic device according to various example embodiments of the disclosure may include: a housing comprising: an outer portion defining at least a portion of an exterior of the electronic device and comprising titanium; an inner portion comprising magnesium and/or aluminum and defining a space for receiving multiple electronic components arranged inside the electronic device; and a middle portion comprising the magnesium and/or the aluminum and an injection molded insulator, wherein a portion of the middle portion is coupled to the outer portion to define a concave-convex structure, and another portion of the middle portion is electrically connected to the inner portion.

An electronic device according to various example embodiments of the disclosure may include: a housing comprising: an outer portion defining at least a portion of an exterior of the electronic device and comprising a first conductive material; an inner portion comprising a second conductive material different from the first conductive material and having a first melting point, and defining a space for receiving multiple electronic components arranged inside the electronic device; and a middle portion comprising a third conductive material having a second melting point and an injection molded insulator, wherein the third conductive material of the middle portion and the first conductive material of the outer portion are coupled to define a concave-convex structure, a difference between the first melting point and the second melting point being a value within a first range, the third conductive material of the middle portion being electrically connected to a portion of the inner portion, and the middle portion and a portion of the inner portion are made by a diecasting method.

An electronic device according to various example embodiments of the disclosure may include: a housing comprising: an outer portion defining at least a portion of an exterior of the electronic device and comprising a first conductive material; an inner portion comprising a second conductive material different from the first conductive material and having a first melting point, and defining a space for receiving multiple electronic components arranged inside the electronic device; and a middle portion comprising a third conductive material having a second melting point and an injection molded insulator, wherein the third conductive material of the middle portion and the first conductive material of the outer portion are coupled to define a concave-convex structure, a difference between the first melting point and the second melting point having a value within a first range, and the third conductive material of the middle portion being electrically connected to the second conductive material of the inner portion.

According to various example embodiments disclosed herein, an electronic device may become lightweight.

In addition, according to various example embodiments, an electronic device including a metal housing may be manufactured with reduced cost and time.

Various other advantageous effects identified explicitly or implicitly through the disclosure may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In connection with a description of the drawings, like or similar reference numerals may be used for like or similar elements.

DETAILED DESCRIPTION

Hereinafter, various example embodiments of the disclosure will be described in greater detail with reference to the accompanying drawings. However, this is not intended to limit the disclosure to specific embodiments, and it should be understood that various modifications, equivalents, and/or alternatives of the embodiments of the disclosure are included.

Figure 1:
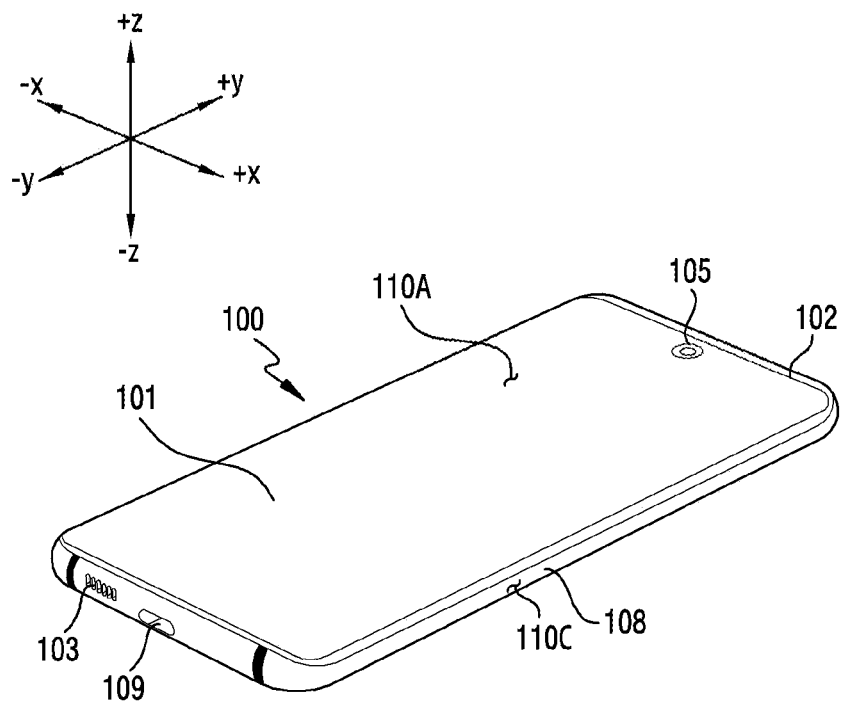
FIG. 1 is a front perspective view of an electronic device according to various embodiments.
Figure 2:
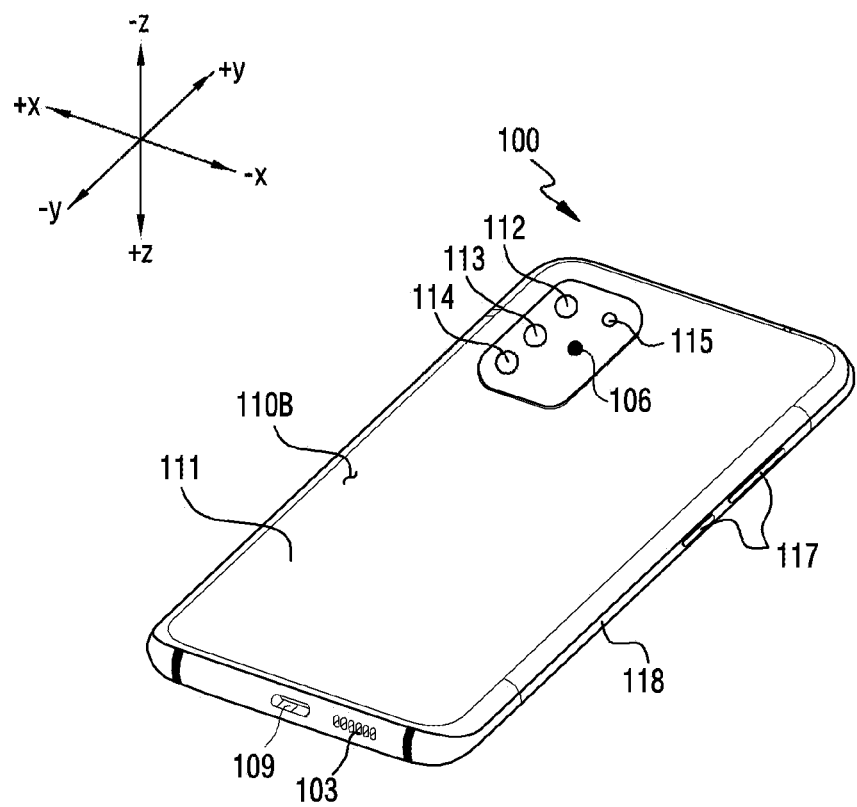
FIG. 2 is a rear perspective view of an electronic device according to various embodiments.

FIG. 1 is a front perspective view of an electronic device 100 (e.g., the electronic device 100 in FIG. 1) according to various embodiments, and FIG. 2 is a rear perspective view of the electronic device 100 in FIG. 1 according to various embodiments.

The electronic device 100 according to an embodiment of the disclosure will be described by taking a bar-type electronic device as an example, but an example to be described below may be applied to an electronic device such as slidable, rollable, and foldable types without limitation thereto.

Referring to FIG. 1 and FIG. 2 together, the electronic device 100 according to an embodiment may include a housing 110 including a first surface (or "front surface") 110A, a second surface (or "rear surface") 110B, and a lateral surface (or "lateral wall") 110C surrounding a space between the first surface 110A and the second surface 110B. In an embodiment (not shown), the housing 110 may refer to a structure configuring a portion of the first surface 110A, the second surface 110B, and the lateral surface 110C in FIG. 1 and FIG. 2.

According to an embodiment, at least a portion of the first surface 110A may be configured by substantially transparent front plate 102 (e.g., a glass plate including various coating layers, or a polymer plate). According to an embodiment, at least one side edge portion of the front plate 102 may include a curved surface portion seamlessly extending and bending from the first surface 110A toward the rear plate 111.

According to an embodiment, the second surface 110B may be configured by the substantially opaque rear plate 111. The rear plate 111 may be formed by, for example, coated or colored glass, ceramic, polymers, metals (e.g., aluminum, stainless steel (STS), or magnesium), or a combination of at least two thereof. According to an embodiment, at least one side edge portion of the rear plate 111 may include a curved surface portion seamlessly extending and bending from the second surface 110B toward the front plate 102.

According to an embodiment, the lateral surface 110C may be coupled to the front plate 102 and the rear plate 111 and may be configured by a lateral member 108 including a metal and/or polymer. In an embodiment, the rear plate 111 and the lateral member 108 may be integrally formed and include the same material (e.g., metal material such as aluminum).

According to an embodiment, the electronic device 100 may include at least one of a display 101, an audio module 103, a sensor module (not shown), a first camera module 115, 112, 113, 114, a key input device 117, and a connector hole 109. In an embodiment, the electronic device 100 may omit one or more components (e.g., the key input device 117) or additionally include another component.

In an embodiment, the electronic device 100 may include a sensor module (not shown). For example, the sensor module may be disposed on a rear surface of a screen display area of the display 101 seen from the outside of the electronic device 100 through the front plate 102.

For example, at least one of an optical sensor, an ultrasonic sensor, or a capacitive sensor may be disposed on a rear surface of the screen display area of the display 101 but is not limited thereto.

In an embodiment, the electronic device 100 may further include a light-emitting element, and the light-emitting element may be disposed at a position adjacent to the display 101 in an area provided by the front plate 102. The light-emitting element may provide state information of the electronic device 100 in a form of light, for example. In an embodiment, the light emitting element may provide, for example, a light source associated with an operation of the camera module 105. The light-emitting element may include, for example, a light emitting diode (LED), an infrared LED (IR LED), and/or a xenon lamp.

According to an embodiment, the display 101 may be seen from the outside of the electronic device 100 through a substantial portion of the front plate 102. In an embodiment, an edge of the display 101 may be formed to be roughly identical to a frame shape (e.g., a curved surface) adjacent to the front plate 102.

According to an embodiment (not shown), the electronic device 100 may form a recess, a notch, or an opening on a portion of a screen display area of the display 101, and various electronic components, for example, the camera module 105 or the sensor module (not shown) may be disposed on the recess, the notch, or the opening.

According to an embodiment (not shown), at least one of the camera module (e.g., 112, 113, 114, and 115), a fingerprint sensor, and a flash (e.g., 106) may be disposed on the rear surface of the screen display area of the display 101. According to an embodiment (not shown), the display 101 may be combined to or disposed adjacent to a touch sensing circuit, a pressure sensor for measuring a strength (pressure) of a touch, and/or a digitizer for detecting a magnetic field-type stylus pen.

According to an embodiment, the audio module 103 may include a microphone hole and a speaker hole. A microphone for obtaining a sound from outside may be disposed in the microphone hole and in an embodiment, multiple microphones are arranged to detect a direction of a sound.

According to an embodiment, a speaker hole and a microphone hole may be integrated into one hole and a speaker may be included without a speaker hole (e.g., piezo speaker). For example, a speaker hole may include an outer speaker hole and a receiver hole for calling.

The electronic device 100 may include a sensor module (not shown) and may thus generate an electrical signal or a data value corresponding to an internal operation state or external environment state. The sensor module may include a proximity sensor disposed on the first surface 110A of the housing 110, a fingerprint sensor disposed on the rear surface of the display 101, and/or a biometric sensor (e.g., an HRM sensor) disposed on the second surface 110B of the housing 110.

The sensor module may further include at least one from among, for example, a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, and an illuminance sensor.

According to an embodiment, the camera module 105, 112, 113, 114, 115 may include the first camera module 105 disposed on the first surface 110A of the electronic device 100, the second camera module 112, 113, 114, 115 disposed on the second surface 110B, and/or the flash 106. For example, the camera modules 105, 112, 113, 114, 115 may include one or more of lenses, an image sensor, and/or an image signal processor. The flash 106 may include, for example, a light-emitting diode or a xenon lamp. In an embodiment, two or more lenses (infrared camera, wide-angle, and telephoto lens) and image sensors may be arranged on one surface of the electronic device 100.

According to an embodiment, the key input device 117 may be disposed on the lateral surface 110C of the housing 110. According to an embodiment, the electronic device 100 may not include a portion or entirety of the key input device 117 described above, and the excluded key input device 117 may be implemented as various forms such as a soft key on the display 101. In an embodiment, the key input device may include at least a portion of a fingerprint sensor disposed on the second surface 110B of the housing 110.

According to an embodiment, the connector hole 109 may receive a connector for transmitting/receiving power and/or data to or from an external electronic device, and/or a connector for transmitting/receiving an audio signal to or from an external electronic device. For example, the connector hole 109 may include a USB connector or an earphone jack. In an embodiment, the USB connector and the earphone jack may be implemented as one integrated hole (e.g., 108 of FIG. 1 and FIG. 2), and according to an embodiment (now shown), the electronic device 100 may transmit/receive power and/or data, or transmit/receive an audio signal to or from an external electronic device without a separate connector hole.

Figure 3:
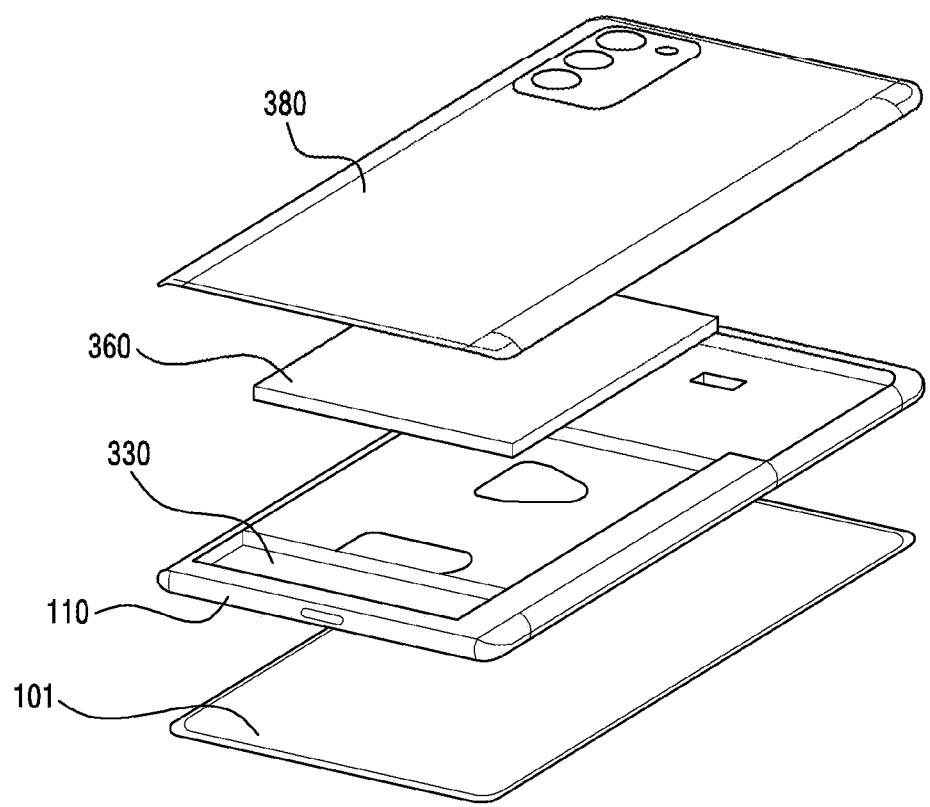
FIG. 3 is an exploded perspective view illustrating an electronic device according to various embodiments

FIG. 3 is an exploded perspective view illustrating an electronic device according to various embodiments.

Referring to FIG. 3, the electronic device 100 according to an embodiment may include the display 101, the housing 110, at least one printed circuit board 330 (hereinafter, "a printed circuit board (PCB)"), a battery 360, and/or a rear cover 380.

According to an embodiment, the display 101 may be disposed on a front surface (110A in FIG. 1) of the electronic device 100. According to an embodiment, one surface (e.g., a surface in +z direction in FIG. 3) of the display 101 may be disposed on the front surface of the electronic device 100 to be visible to the outside and another surface (e.g., a surface in −z direction in FIG. 3) of the display 101 may face the inside of the electronic device 100 and have at least one PCB 330 and/or the battery 360 disposed thereon.

According to an embodiment, various electronic components may be disposed on the at least one PCB 330. In an embodiment, a processor (e.g., the processor 1120 in FIG. 11), a memory (e.g., the memory 1130 in FIG. 11), and/or an interface (e.g., the interface 1177 in FIG. 11) may be disposed on the at least one PCB 330.

According to an embodiment, the processor may include at least one of a central processing unit, an application processor, a graphic processing unit, an image signal processor, a sensor hub processor, and a communication processor.

According to an embodiment, the memory may include a volatile memory or a nonvolatile memory.

According to an embodiment, the interface may include a high-definition multimedia interface (HDMI), a universal serial bus (USB) interface, an SD card interface, and/or an audio interface. The interface, for example, may electrically or physically connect the electronic device 100 to an external electronic device, and may include a USB connector, an SD card/MMC connector, or an audio connector.

According to an embodiment, the battery 360 may be disposed between the housing 110 and the rear cover 380. According to an embodiment, the battery 360 may be disposed on the PCB 330, and the battery 360 may be electrically connected to the PCB 330.

In an embodiment, the battery 360 may provide power required for at least one electronic component (e.g., a first antenna module, a second antenna module, a processor, and the like) arranged in the electronic device 100 to be operated. For example, the battery 360 may include a non-rechargeable primary battery, a rechargeable secondary battery, or a fuel cell. At least a part of the battery 360 may be disposed, for example, on a substantially identical plane to the PCB 330. According to an embodiment, the battery 360 may be integrally disposed in the electronic device 100 or may be disposed to be attachable to/detachable from the electronic device 100.

According to an embodiment, the housing 110 may reduce damage to the at least on PCB 330 disposed inside the electronic device 100 and/or various electronic components arranged on the at least one PCB 330 by external impact.

According to an embodiment, the housing 110 may include a metal frame structure (not shown). In an embodiment, a portion of the metal frame structure may be made of a conductive material (e.g., a metal) and may form a lateral surface (e.g., the lateral surface 110C in FIG. 1) of the electronic device 100. For example, the metal frame structure may include at least one conductive portion and/or at least one non-conductive portion for insulating the at least one conductive portion.

According to an embodiment, the at least one conductive portion of the metal frame structure may be operated as an antenna radiator for transmitting and/or receiving an RF signal of a specified frequency band. In an embodiment, at least one conductive pattern may be disposed on at least one area of the housing 110.

According to an embodiment, the at least one conductive pattern may be operated as an antenna radiator for transmitting and/or receiving an RF signal of an ultra-wide band (UWB) together with the first antenna module (not shown).

According to an embodiment, the rear cover 380 may form a rear surface (e.g., the second surface 110B in FIG. 2) of the electronic device 100. According to an embodiment, the housing 110 may protect internal components of the electronic device 100 from an external impact or foreign substance introduction.

Figure 4:
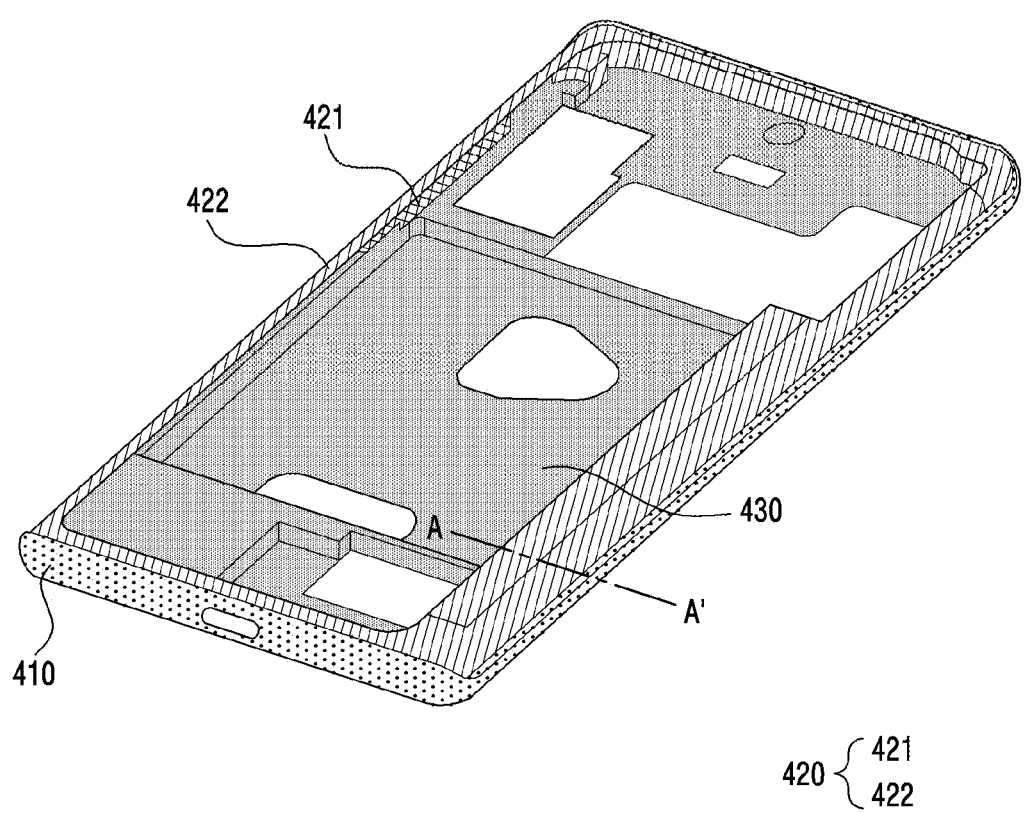
FIG. 4 is a diagram illustrating the inside of an electronic device according to various embodiments.

FIG. 4 is a diagram illustrating the inside of an electronic device according to various embodiments.

According to an embodiment, FIG. 4 is a diagram illustrating the housing 110 of the electronic device 100 in FIG. 3.

According to an embodiment, the housing 110 of the electronic device 100 may include an outer member (e.g., outer portion) 410 defining at least a portion of an exterior of the electronic device 100, an inner member (e.g., inner portion) 430 at least partially defining an interior of the electronic device 100, and a middle member (e.g., middle portion) 420 disposed between the outer member 410 and the inner member 430.

According to an embodiment, the outer member 410 may form at least a portion of the exterior of the electronic device 100. For example, a portion of the outer member 410 may correspond to the lateral member 108 of the housing 110 of the electronic device 100.

According to an embodiment, a portion of the outer member 410 may be exposed outside the electronic device 100 and visually recognized by a user.

According to an embodiment, at least a portion of the outer member 410 may be formed to surround the display 101 of the electronic device 100 and/or a front case (320 in FIG. 3) and the rear cover 380. For example, a portion of the outer member 410 may be formed surrounding the display 101 of the electronic device 100 or an edge of the front case 320 and another portion thereof may be formed to surround an edge of the rear cover 380.

According to an embodiment, the outer member 410 may be made of a first material. According to an embodiment, the outer member 410 may be made of a first conductive material. For example, the first conductive material of the outer member 410 may be made of a metal material. In an embodiment, the outer member 410 may be made of titanium and/or SUS but is not limited thereto. For example, the outer member 410 may be made of at least one metal material from among aluminum and magnesium.

According to an embodiment, the inner member 430 may be formed inside the electronic device 100. For example, the inner space of the electronic device 100 may be formed by the inner member 430. In an embodiment, the space formed by the inner member 430 may receive multiple electronic components (e.g., the battery 360) therein. For example, the PCB 330 may be received in the space formed by the inner member 430.

According to an embodiment, the inner member 430 may support multiple electronic components. For example, a portion of the inner member 430 may be disposed on the rear surface of the display 101 to support the display 101. According to an embodiment, a portion of the inner member 430 may support the battery 360 and/or a speaker (not shown).

According to an embodiment, the inner member 430 may be made of a second material distinguished or different from the outer member 410. In an embodiment, the second material of the inner member 430 may include a conductive material and/or a non-conductive material. For example, a second conductive material of the second material of the inner member 430 may correspond to a metal material (e.g., titanium, SUS, aluminum, or magnesium). According to an embodiment, a portion of the second material of the inner member 430 may further include a non-conductive material (e.g., a plastic material).

According to an embodiment, the second material of the inner member 430 may correspond to the second conductive material distinguished or different from the first conductive material of the outer member 410. For example, in case that the first conductive material of the outer member 410 is made of titanium and/or SUS, the second conductive material of the second material of the inner member 430 may be made of magnesium and/or aluminum.

According to an embodiment, the second conductive material of the inner member 430 may correspond to a material distinguished from the first conductive material of the outer member 410. For example, the second conductive material may have material properties different from those of the first conductive material. For example, the inner member 430 and the outer member 410 may have different specific gravities or densities. A part as described with specific gravity may be replaced by density in the disclosure.

According to an embodiment, the second conductive material of the inner member 430 may have specific gravity different from that of the first conductive material of the outer member 410. For example, the first conductive material of the outer member 410 may have a first specific gravity, and the second conductive material of the inner member 430 may have a second specific gravity.

According to an embodiment, the first specific gravity may have a value larger than that of the second specific gravity. For example, the first conductive material of the outer member 410 may correspond to titanium or steel use stainless (SUS) having a first specific gravity, and the second conductive material of the inner member 430 may correspond to magnesium or aluminum having a second specific gravity smaller than the first specific gravity.

According to an embodiment, as the second conductive material of the inner member 430 is made of a material having a specific gravity lower than that of the first conductive material of the outer member 410 which forms the exterior of the electronic device 100, a weight of the electronic device 100 may be smaller than that of the electronic device 100 made of a single metal material.

In addition, by including a metal such as aluminum and/or magnesium having a low specific gravity, the manufacturing difficulty may be lowered and the manufacturing cost may be reduced.

According to an embodiment, the inner member 430 may be manufactured by a diecasting method. However, the method for manufacturing the inner member 430 is not limited to the diecasting method. In an example, the inner member 430 may be manufactured by a press method. For example, at least portion of the inner member 430 may be configured by a sheet manufactured by a press method. According to an embodiment, as the inner member 430 is manufactured by the press method, the inner member may partially include a metal (e.g., titanium or SUS) having a high specific gravity.

According to an embodiment, the electronic device 100 may include the middle member 420 disposed between the outer member 410 and the inner member 430.

According to an embodiment, a portion of the middle member 420 may form the inside of the electronic device 100 and another portion of the middle member 420 may form the exterior of the electronic device 100. For example, an insulator of the middle member 420 may be exposed outside the electronic device 100 and form the exterior of the electronic device 100 together with the outer member 410. According to an embodiment, a conductive material of the middle member 420 may be configured by a medium for connecting the inner member 430 and the outer member 410 inside the electronic device 100.

According to an embodiment, the middle member 420 may include a third conductive material 421 and an insulator 422. For example, the middle member 420 may include a metal member and a plastic material.

According to an embodiment, the third conductive material 421 of the middle member 420 may have material properties substantially identical to those of the second conductive material of the second material of the inner member 430.

According to an embodiment, the second conductive material of the inner member 430 may have a first melting point and the third conductive material 421 of the middle member 420 may have a second melting point.

According to an embodiment, the first melting point of the second conductive material and the second melting point of the third conductive material 421 may be melting points having a difference within a first range. According to an embodiment, the melting points within the first range may refer, for example, to a temperature range required for welding connection between the second conductive material and the third conductive material 421.

According to an embodiment, the difference within the first range may have a value of 11° C., but is not limited thereto. For example, the difference within the first range of the first melting point of the second conductive material and the second melting point of the third conductive material 421 may have a difference exceeding 11° C.

According to an embodiment, the first melting point and the second melting point may have substantially the same temperature. In other words, according to an embodiment, the difference within a first range of the first melting point and the second melting point may correspond to 0° C. For example, the second conductive material and the third conductive material 421 may be made of materials having substantially the same melting point. In an embodiment, the second conductive material may be made of magnesium (e.g., a melting point of 650° C.) having a first melting point and the third conductive material 421 may be made of magnesium (e.g., a melting point of 650° C.) having a second melting point substantially the same as the first melting point.

According to an embodiment, the first melting point and the second melting point may have a difference of 2° C. For another example, the first melting point and the second melting point may have a difference of 10° C.

According to an embodiment, the third conductive material 421 may be made of a material having a second melting point having a difference within a first range from a first melting point of the second conductive material. In an example, the second conductive material may be made of magnesium (e.g., a melting point of 650° C.) having a first melting point and the third conductive material 421 may be made of aluminum (e.g., a melting point of 660.32° C.) having a second melting point having a difference of about 10° C. from the first melting point.

According to an embodiment, as the middle member 420 and the inner member 430 have melting points within a first range, the middle member 420 and the inner member 430 may be electrically connected by means of a connection relationship to be described below.

An embodiment related to the connection relationship of the middle member 420 and the inner member 430 will be described in greater detail below with reference to FIG. 6.

According to an embodiment, the insulator 422 of the middle member 420 may correspond to a plastic material.

For example, the insulator 422 may be formed by mixing a thermoplastic resin and inorganic compounds. According to an embodiment, the thermoplastic resin may correspond to polycarbonate (PC) and polyphthalamide (PPA), but is not limited thereto. For example, the thermoplastic resin may correspond to polyethylene terephthalate (PET).

According to an embodiment, an adhesive layer configured by an organic bonding film may be applied on an outer surface of the insulator 422. According to an embodiment, as the adhesive layer configured by an organic bonding film is applied on the outer surface of the insulator 422, an adhesion property among the first conductive material of the outer member 410, the second conductive material of the inner member 430, and/or the third conductive material 421 and the insulator 422 of the middle member 420 may be improved.

According to an embodiment, the third conductive material 421 of the middle member 420 may be made by a diecasting method. For example, the diecasting method for forming the third conductive material 421 of the middle member 420 may be substantially the same as the diecasting method for forming the second conductive material of the inner member 430, but is not limited thereto. According to an embodiment, the diecasting method for forming the third conductive material 421 of the middle member 420 may be different from the diecasting method for forming the second conductive material of the inner member 430 in some processing processes.

According to an embodiment, the insulator 422 of the middle member 420 may be formed by injection molding. For example, after the outer member 410, the third conductive material 421 of the middle member 420, and the inner member 430 are formed, the injection molded insulator 422 of the inner member 420 is formed in a portion of a space of the electronic device 100.

An embodiment related to a method for forming the outer member 410, the middle member 420, and the inner member 430 will be described in greater detail below with reference to FIG. 9 to FIG. 10.

According to an embodiment, by forming the outer member 410, the middle member 420, and the inner member 430 with different materials, the electronic device 100 may be reduced in weight and the manufacturing difficulty and cost of the electronic device 100 may be reduced.

Figure 5:
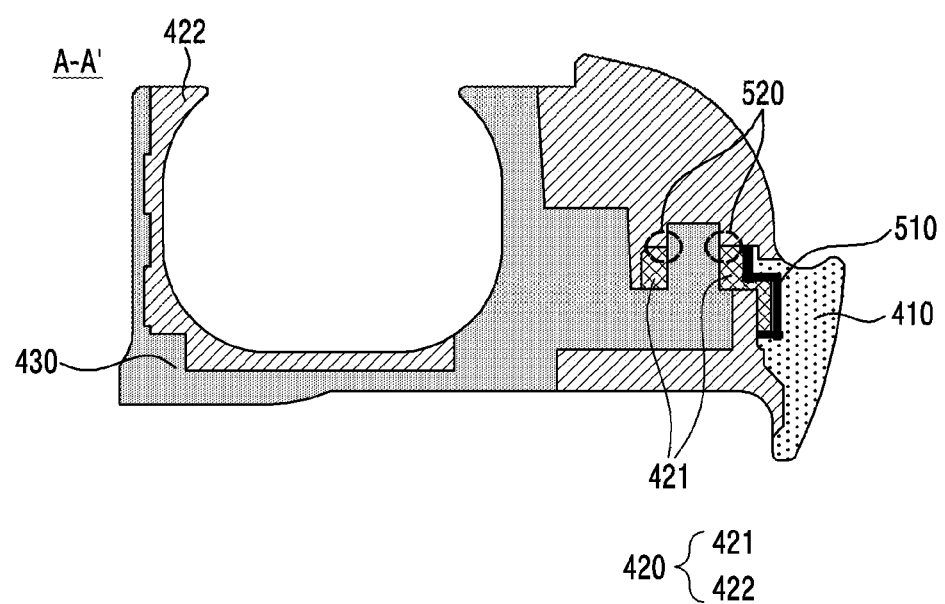
FIG. 5 is a sectional view of the electronic device in FIG. 4 taken along line A-A' according to various embodiments.

FIG. 5 is a sectional view of the electronic device in FIG. 4 taken along line A-A' according to various embodiments.

Referring to A-A' section in FIG. 5, the outer member 410 may configure the exterior of the electronic device 100, the inner member 430 may configure the interior of the electronic device 100, and the third conductive material 421 of the middle member 420 may be disposed between the outer member 410 and the inner member 430.

According to an embodiment, a portion of the insulator 422 of the middle member 420 may configure the exterior of the electronic device 100 together with the outer member 410 and another portion thereof may configure the interior of the electronic device 100 together with the inner member 430.

According to an embodiment, the outer member 410 may be disposed at an edge of the electronic device 100. For example, the outer member 410 may be disposed at an edge of the electronic device 100 to be exposed outside the electronic device 100.

According to an embodiment, as the outer member 410 configures the exterior of the electronic device 100, the outer member 410 may protect the electronic device 100 from external impact. For example, as the first conductive material of the outer member 410 is configured by a metal member having a specific gravity higher than that of the second conductive material of the inner member 430, the outer member 410 may reduce damage to the electronic device 100 by external impact. In other words, as the exterior of the electronic device 100 is made of a material having a specific gravity higher than other components of the electronic device 100, the durability of the electronic device 100 may be secured.

According to an embodiment, the outer member 410 may be connected to the middle member 420. For example, the first conductive material of the outer member 410 may be electrically connected to the third conductive material 421 of the middle member 420.

According to an embodiment, the first conductive material of the outer member 410 may be connected to at least a portion of the middle member 420 while forming a first coupling structure 510. For example, the first conductive material of the outer member 410 and the third conductive material 421 of the middle member 420 may be connected to each other by forming the first coupling structure 510 while facing each other. For example, the first coupling structure 510 may correspond to a concave-convex structure.

According to an embodiment, a recess may be formed on a portion of the first conductive material of the outer member 410, and a protrusion which may be received in the recess on the outer member 410 may be formed on a portion of the third conductive material 421 of the middle member 420. According to an embodiment, the outer member 410 and the middle member 420 may be coupled to each other as the protrusion of the third conductive material 421 is received in the recess of the first conductive material of the outer member 410. That is, according to an embodiment, the outer member 410 and the middle member 420 may be coupled to each other as the first coupling structure 510 of the outer member 410 and the middle member 420 is formed in the concave-convex structure.

According to an embodiment, the insulator 422 may be injection molded surrounding a periphery of the third conductive material 421 and the first conductive material in a state in which the third conductive material 421 and the first conductive material form the concave-convex structure. According to an embodiment, as the insulator 422 is injection molded surrounding the periphery, the third conductive material 421 and the first conductive material may be fixed in a coupled state. In other words, according to an embodiment, the first conductive material and the third conductive material 421 may be fixed in a coupled state by the injection-molded insulator 422.

According to an embodiment, as the first coupling structure 510 is formed in the concave-convex structure, the middle member 420 and the outer member 410 are connected to each other without an additional connection member. For example, the middle member 420 and the outer member 410 may be electrically connected to each other without a welding member.

The first coupling structure 510 of the first conductive material and the third conductive material 421 is described by taking the concave-convex structure as an example, but is not limited thereto. For example, the first coupling structure 510 of the first conductive material and the third conductive material 421 may be formed by adding an adhesive member (e.g., a bond) applied thereto.

According to an embodiment, the inner member 430 may be connected to the middle member 420. For example, the second material (e.g., the second conductive material) of the inner member 430 may be electrically connected to the third conductive material 421 of the middle member 420.

According to an embodiment, the second conductive material of the inner member 430 may be connected to at least a portion of the middle member 420 while forming a second coupling structure 520. For example, the second conductive material of the inner member 430 and the third conductive material 421 of the middle member 420 may be connected to each other by forming the second coupling structure 520 while facing each other. For example, the second coupling structure 520 may correspond to a structure including an additional connection member (e.g., an adhesive or welding).

An embodiment related to the second coupling structure 520 will be described below with reference to FIG. 6.

Referring FIG. 5, a portion of the electronic device 100 may be configured by the insulator 422 of the middle member 420. For example, the insulator 422 may be formed together with the inner member 430 at a portion of the inner space of the electronic device 100, and the insulation member 422 may be formed together with the outer member 410 at a portion of the exterior of the electronic device 100.

According to an embodiment, the insulator 422 of the middle member 420 may correspond to a material for adhering the outer member 410 and the middle member 420 and/or the inner member 430 and the middle member 420.

For example, the first coupling structure 510 formed between the first conductive material of the outer member 410 and the third conductive material 421 of the middle member 420 may be adhered by being surrounded by the insulator 422. According to an embodiment, the second coupling structure 520 formed between the second conductive material of the inner member 430 and the third conductive material 421 of the middle member 420 may be adhered by being surrounded by the insulator 422.

According to an embodiment, the inclusion of the insulator 422 inside the electronic device 100 may reduce the electronic device 100 in weight and the manufacturing difficulty and cost of the electronic device 100.

According to an embodiment, the wireless communication circuit included in the electronic device 100 may transmit and/or receive signals in various frequency bands by feeding at least a portion of the housing 110 (e.g., the first conductive material of the outer member 410) of the electronic device 100, which made of a metal material.

According to an embodiment, the outer member 410 and the middle member 420 may be electrically connected to each other by the first coupling structure 510, and the electronic device 100 may transmit and/or receive a signal in a designated frequency using the first coupling structure 510. For example, the electronic device 100 may transmit and/or receive a signal in a designated frequency, based on an electrical path including the first coupling structure 510 configured to electrically connect the outer member 410 and the middle member 420.

Figure 6:
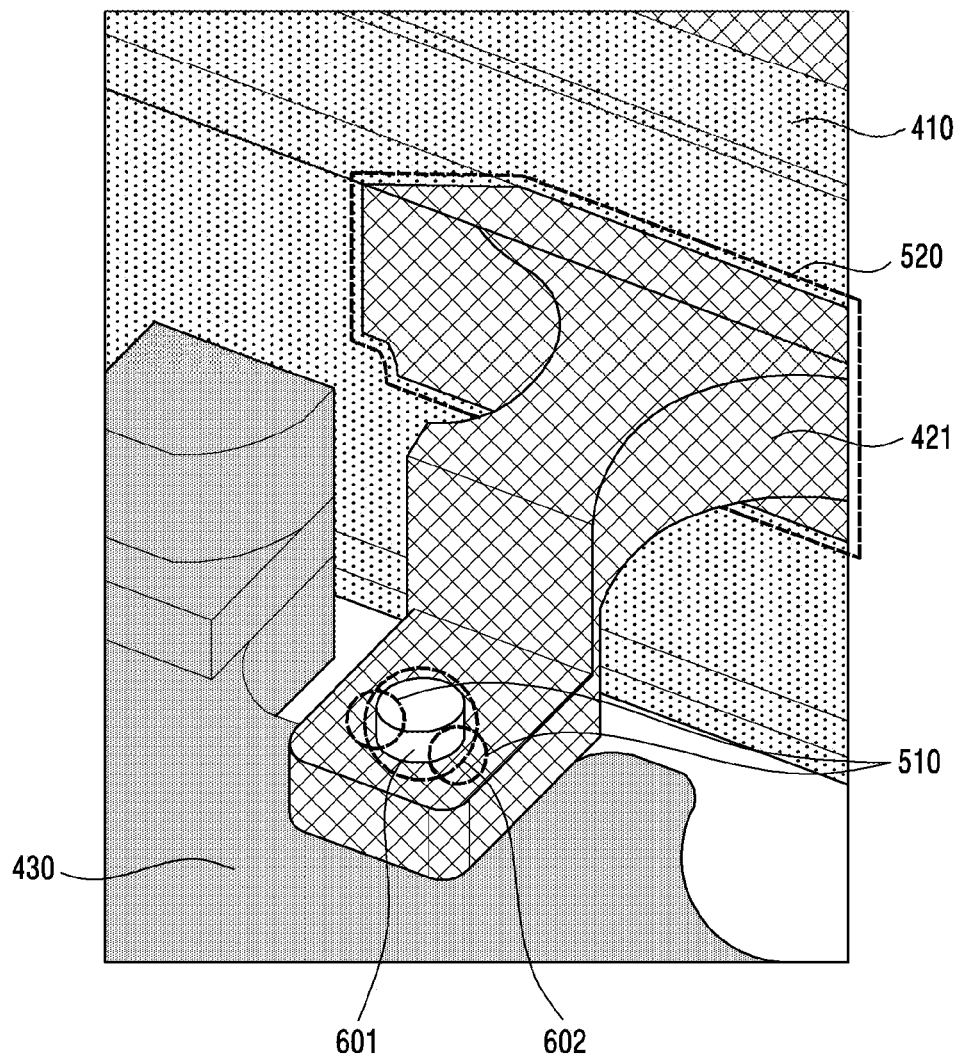
FIG. 6 is a partial perspective view illustrating a coupling structure of an inner member and a middle member of an electronic device according to various embodiments.

FIG. 6 is a partial perspective view illustrating a coupling structure of an inner member and a middle member of an electronic device according to various embodiments.

Referring to FIG. 6, the outer member 410 may be connected to the middle member 420 while having the first coupling structure 510, and the inner member 430 may be connected to the middle member 420 while having the second coupling structure 520.

According to an embodiment, the inner member 430 may be coupled to the third conductive material 421 of the middle member 420. For example, the inner member 430 may form a protrusion 601 and the third conductive material 421 of the middle member 420 may form a hall 602. According to an embodiment, the inner member 430 may be coupled to the middle member 420 by inserting the protrusion 601 of the inner member 430 into the hall 602 of the third conductive material 421.

According to an embodiment, the electronic device 100 may form the second coupling structure 520 by including an additional connection member in a state in which the inner member 430 and the middle member 420 are coupled to each other. For example, the additional connection member may correspond to a welding material.

For example, the first conductive material of the outer member 410 may have a melting point of a first temperature, and the second conductive material of the inner member 430 may have a melting point of a second temperature. According to an embodiment, the third conductive material 421 of the middle member 420 may have a melting point of a third temperature.

According to an embodiment, the first conductive material of the outer member 410 may correspond to a material having a melting point substantially different from that of the second conductive material of the inner member 430.

According to an embodiment, the second conductive material of the inner member 430 may correspond to a conductive material having a melting point different from that of the first conductive material 421 of the middle member 420 within a first range.

According to an embodiment, the melting point of the first temperature of the first conductive material may have a temperature higher than that the melting point of the second temperature of the second conductive material.

According to an embodiment, the melting point of the third temperature of the third conductive material 421 may have a difference from the melting point of the second temperature of the second conductive material within a first range.

According to an embodiment, as the melting point of the first temperature and the melting point of the second temperature have different temperatures, it may be substantially difficult that the first conductive material of the outer member 410 and the second conductive material of the inner member 430 are electrically connected to each other by welding. For example, in case that there is a difference between the melting point of the first temperature and the melting point of the second temperature, a bubble may be generated in a welding region of the second conductive material of the inner member 430 having a lower melting point and thus an adhesion defect between the first conductive material of the outer member 410 and the second conductive material of the inner member 430 may occur.

Meanwhile, according to an embodiment, as the melting point of the second temperature and the melting point of the third temperature have a difference within a first range, the second conductive material of the inner member 430 may be electrically connected to the third conductive material 421 of the middle member 420 by welding.

However, the second coupling structure 520 formed between the inner member 430 and the middle member 420 is not limited to the welding. For example, the second coupling structure 520 may be formed by further applying a conductive adhesive material. According to an embodiment, the second coupling structure 520 may be formed as a structure in which the middle member 420 and the inner member 430 are assembled to be coupled to each other. For another example, the second coupling structure 520 formed between the inner member 430 and the middle member 420 may include soldering. For example, the inner member 430 and the middle member 420 may be coupled to each other by soldering.

According to an embodiment, the inner member 430 and the middle member 420 may be electrically connected to each other by the second coupling structure 520 including a welding material or a conductive adhesive material, and the electronic device 100 may transmit and/or receive a signal in a designated frequency using the second coupling structure 520. For example, the electronic device 100 may transmit and/or receive a signal in a designated frequency, based on an electrical path including the second coupling structure 520 configured to electrically connect the inner member 430 and the middle member 420.

An embodiment related to the electrical path using the second coupling structure 520 will be described in greater detail below with reference to FIG. 7.

Figure 7:
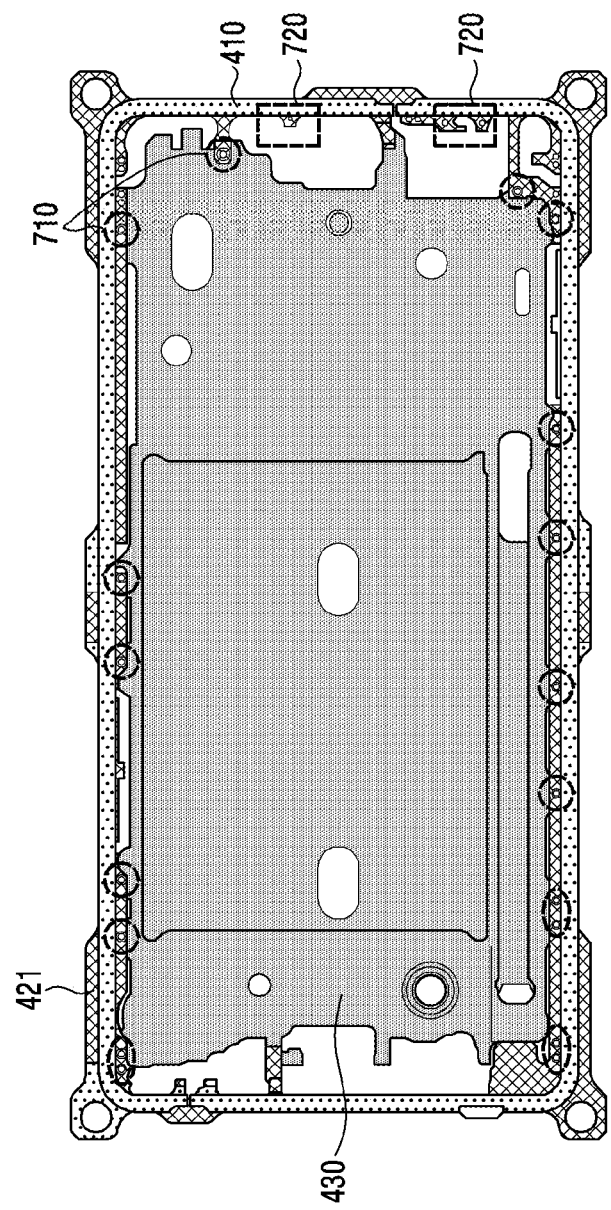
FIG. 7 is a diagram illustrating the inside of an electronic device according to various embodiments.

FIG. 7 is a diagram illustrating the inside of an electronic device according to various embodiments.

Referring to FIG. 7, the inner member 430 and the middle member 420 may be electrically connected to each other at multiple areas.

According to an embodiment, the second conductive material of the inner member 430 and the third conductive material 421 of the middle member 420 may be electrically connected to each other at a first point 710. For example, the first point 710 may correspond to a point in which the second coupling structure 520 is formed, by which the second conductive material of the inner member 430 and the third conductive material 421 of the middle member 420 in FIG. 6 are connected to each other.

According to an embodiment, the first point 710 may be formed at 10 to 20 points inside the electronic device 100, but is not limited thereto. For example, the first point 710 may be formed at more than 20 points. The first point 710 may be formed at less than 10 points.

According to an embodiment, the electronic device 100 may include a PCB (330 in FIG. 3) disposed in a space at which the inner member 430 is formed, and a ground (not shown) and a wireless communication circuit (not shown) may be disposed on the PCB 330.

According to an embodiment, multiple conductive materials (e.g., the third conductive material 421 of the middle member 420) in the electronic device 100 may be electrically connected to the ground in the PCB 330. For example, the third conductive material 421 of the middle member 420 may be electrically connected to the ground of the PCB 330 disposed on the inner member 430 through the first point 710.

According to an embodiment, the multiple conductive materials inside the electronic device 100 may be electrically connected to the wireless communication circuit in the PCB 330. For example, the third conductive material 421 of the middle member 420 may be electrically connected to the wireless communication circuit of the PCB 330 through a second point 720. By way of example, the second point 720 may correspond to a point in which the PCB 330 is directly connected to the middle member 420 while not connected to the inner member 430 or the outer member 410.

According to an embodiment, using the third conductive material 421 electrically connected to the outer member 410 being electrically connected to the PCB 330, the electronic device 100 may use the outer member 410 and the third conductive material 421 of the middle member 420 as an antenna.

According to an embodiment, the electronic device 100 may transmit and/or receive a signal in a designated frequency using the first point 710 in which the middle member 420 and the inner member 430 are connected to each other and the second point 720 in which the middle member 420 and the PCB 330 are connected to each other. For example, the wireless communication circuit may transmit and/or receive a signal in a designated frequency by directly feeding the second point 720 in which the PCB 330 and the third conductive material are electrically connected to each other, based on an electrical path including the third conductive material 421 of the middle member 420, the first conductive material of the outer member 410, and the second conductive material of the inner member 430.

According to an embodiment, using the second conductive material of the inner member 430, the third conductive material 421 of the middle member 420, and/or the first conductive material of the outer member 410 as an electrical path, the electronic device 100 may include the housing 110 reduced in weight and usable as an antenna.

Figure 8:
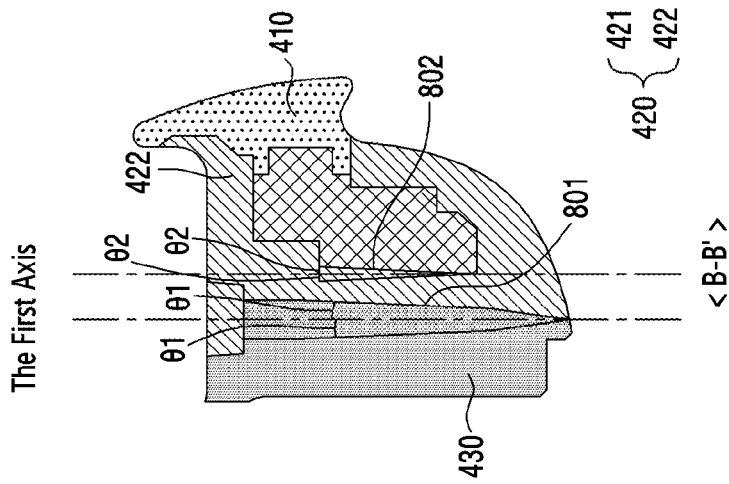
FIG. 8 is a perspective view and a sectional view of an electronic device taken along line B-B' according to according to various embodiments.
Figure 8:
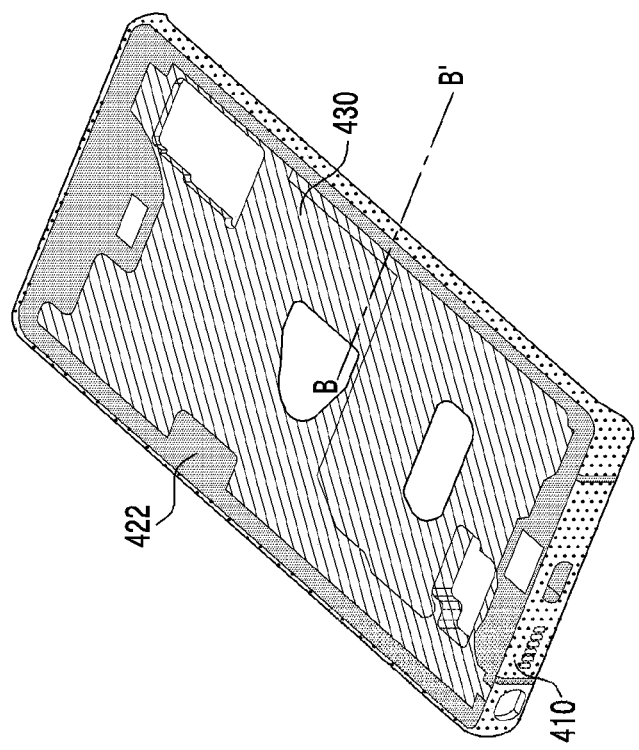

FIG. 8 is a diagram including a perspective view and a sectional view illustrating the inside of an electronic device according to various embodiments.

Referring to B-B' section in FIG. 8, a configuration of the inner member 430 and/or the middle member 420 facing each other may be formed inside the electronic device 100.

For example, the second conductive material of the inner member 430 may directly face the insulator 422 of the middle member 420 and may be formed inside the electronic device 100. In addition, according to an embodiment, the insulator 422 of the middle member 420 and the third conductive material 421 of the middle member 420 may directly face each other and may be formed inside the electronic device 100.

According to an embodiment, a surface where the inner member 430 and the middle member 420 are in contact and a surface where the middle member 420 and the each configuration are in contact may be formed to have a predetermined inclination.

For example, a first interface 801 wherein the second conductive material of the inner member 430 and the insulator 422 of the middle member 420 are in contact may be formed to be slanted having a first angle θ1 with reference to a first axis (e.g., the z-axis). According to an embodiment, a second interface 802 wherein the insulator 422 of the middle member 420 and the third conductive material 421 of the middle member 420 are in contact may be formed to be slanted having a second angle θ2 with reference to the first axis (e.g., the z-axis).

According to an embodiment, the first angle θ1 formed by the first interface 801 and/or the second angle θ2 formed by the second interface 802 may be formed within a range of −10 degrees to +10 degrees. For example, the first angle θ1 formed by the first interface 801 and/or the second angle θ2 formed by the second interface 802 may be +2 degrees. For another example, the first angle θ1 formed by the first interface 801 and/or the second angle θ2 formed by the second interface 802 may be −3 degrees.

However, the first angle θ1 and the second angle θ2 are described as −10 degrees to +10 degrees, but are not limited thereto. For example, the first angle θ1 may be formed to be about 2 degrees or less, and the second angle θ2 may be formed to be about 10 degrees or more.

According to an embodiment, as the first interface 801 is formed to be slanted by the first angle θ1 and/or the second interface 802 is formed to be slanted by the second angle θ2, the manufacturing difficulty of the electronic device 100 may be reduced compared to a case in which the first interface 801 and/or the second interface 802 is not formed to be slanted. For example, in case that the first interface 801 is formed to be slanted by the first angle θ1 and/or the second interface 802 is formed to be slanted by the second angle θ2, the inner member 430 and the middle member 420 may be easily taken out in a process of being manufactured by a diecasting method compared to a case in which the first interface 801 and/or the second interface 802 is not formed to be slanted.

Figure 9:
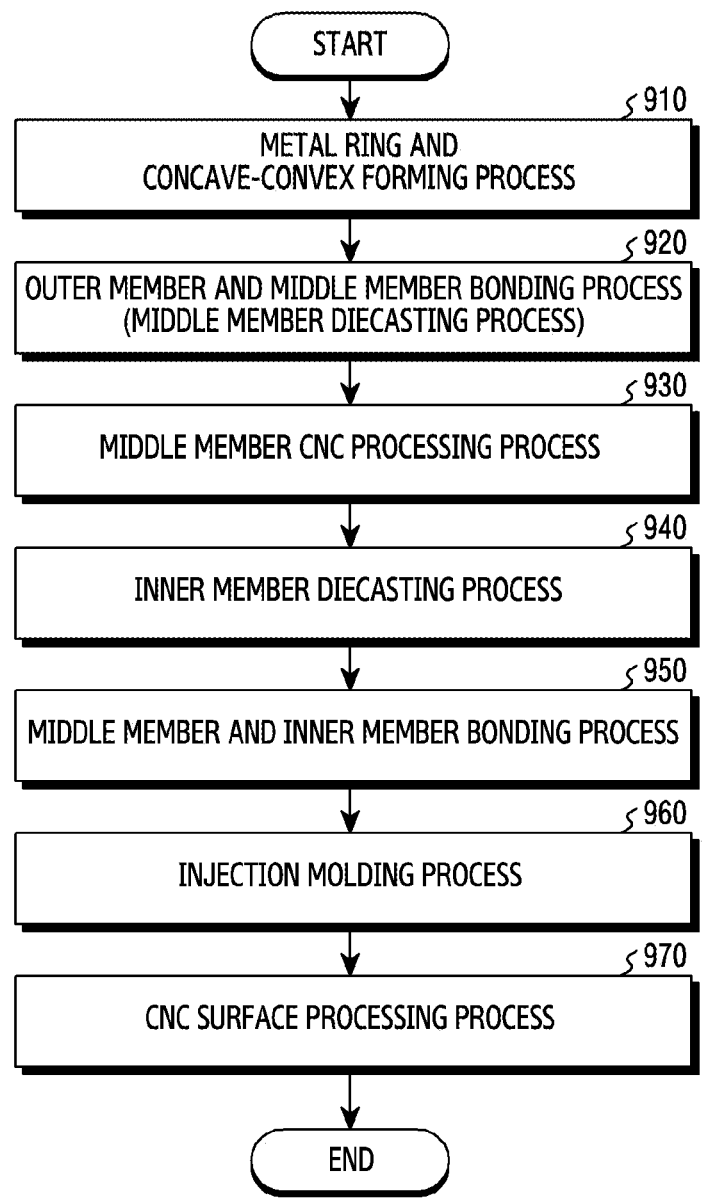
FIG. 9 is a flowchart illustrating an example process of manufacturing an electronic device according to various embodiments.

FIG. 9 is a flowchart illustrating an example process of manufacturing an electronic device according to various embodiments.

Figure 10:
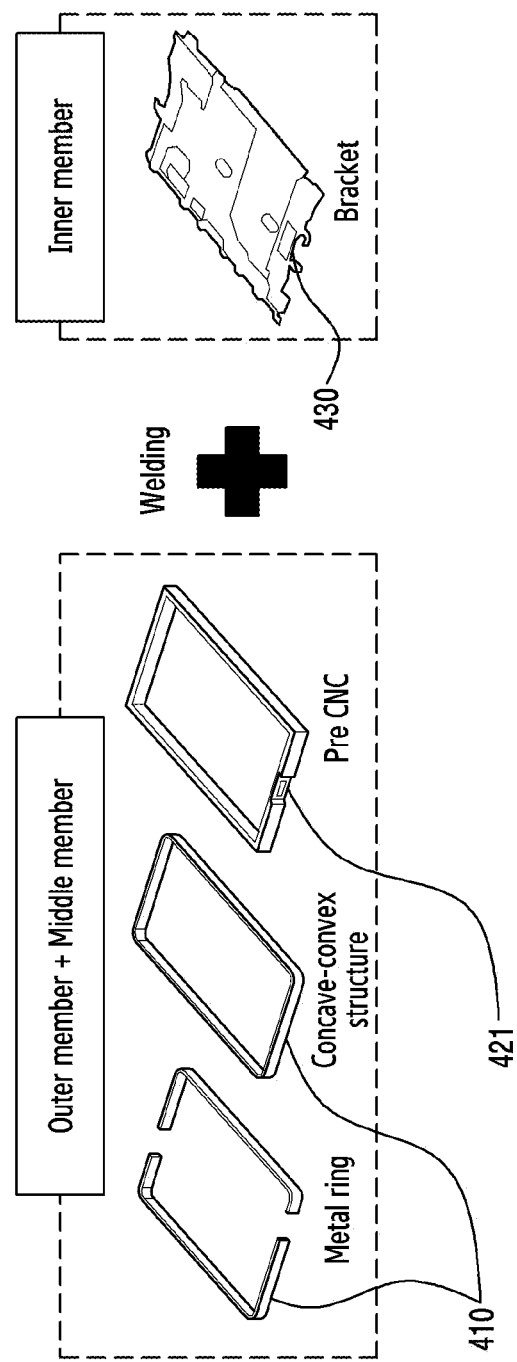
FIG. 10 is a diagram illustrating an example process of manufacturing an electronic device according to various embodiments.

FIG. 10 is a diagram illustrating an example process of manufacturing an electronic device according to various embodiments.

Referring to FIG. 9 and FIG. 10, the electronic device 100 according to an embodiment may be produced by multiple processing processes using the outer member 410, the inner member 430, and the middle member 420.

Referring to FIG. 9 and FIG. 10 according to an embodiment, process 910 may include a process in which a metal ring and a concave-convex structure are produced using the outer member 410.

For example, process 910 may correspond to a process of forming a metal ring structure which forms a portion of the housing 110 of the electronic device 100 using the first conductive material of the outer member 410. For example, the metal ring structure may be a structure corresponding to the lateral member 108 of the housing 110 of the electronic device 100.

In addition, according to an embodiment, process 910 may further include a process of forming the concave-convex structure described above with reference to FIG. 5 in addition to the metal ring structure formation. For example, the first conductive material of the outer member 410 may form a first coupling structure (510 in FIG. 5) for coupling to the third conductive material 421 of the middle member 420 while forming the metal ring structure configured to form the lateral member 108 of the housing 110. For example, the process of forming the first coupling structure 510 may correspond to a process of forming a concave-convex structure to which the third conductive material 421 of the middle member 420 may be coupled by forming a groove at a portion of the first conductive material of the outer member 410.

According to an embodiment, process 920 may correspond to a diecasting process of forming the outer member. For example, process 920 may correspond to a process of bonding the first conductive material of the outer member 410 and the third conductive material 421 of the middle member 420. For example, process 920 may correspond to a process of forming the third conductive material 421 of the middle member 420 by diecasting the third conductive material 421 to the first conductive material of the outer member 410 on which the metal ring and concave-convex structure have been formed.

In other words, according to an embodiment, process 920 may correspond to a process of coupling the outer member 410 and the middle member 420 by bonding the third conductive material 421 to the concave-convex structure formed on the first conductive material of the outer member 410.

According to an embodiment, process 930 may correspond to a process of processing the middle member 420. For example, referring to FIG. 9 and FIG. 10, process 930 may correspond to a process of processing through a computerized numerical control (CNC) process of the third conductive material 421 of the middle member 420. According to an embodiment, process 930 of processing the third conductive material 421 is described as the CNC process, but is not limited thereto. For example, process 930 of processing the third conductive material 421 may correspond to a three dimension printing process.

According to an embodiment, process 940 may correspond to a process of forming the inner member 430 by a diecasting method. For example, process 940 may correspond to a process of forming the second conductive material of the inner member 430 by diecasting the inner member 430 to the middle member 420 coupled to the outer member 410.

However, process 940 is not limited to the diecasting process. For another example, process 940 may further include a process of forming a portion of the inner member 430 with a sheet by a press method.

According to an embodiment, process 950 may correspond to a process of coupling the inner member 430 to the middle member 420 coupled to the outer member 410. In an example, process 950 may further include a process of forming the second coupling structure 520 formed by coupling the second conductive material of the inner member 430 to the third conductive material 421 of the middle member 420 coupled to the outer member 410.

By way of example, process 950 may refer, for example, to a process of welding the inner member 430 and the middle member 420. However, the process of forming the second coupling structure 520 in process 950 is described by taking the welding process as an example, but is not limited thereto. For example, process 950 may correspond to a process of forming the second coupling structure 520 by further including a conductive adhesive member.

According to an embodiment, process 960 may correspond to a process of injection molding a portion of the middle member 420. For example, process 960 may correspond to a process of injection molding the insulator 422 of the middle member 420. By way of example, through process 960, the insulator 422 of the middle member 420 may be injection molded among the second material of the inner member 430, the third conductive material of the middle member 420, and the first conductive material of the outer member 410.

According to an embodiment, process 970 may correspond to a process of processing the exterior of the electronic device 100. For example, process 970 may correspond to a process of processing the exterior of the electronic device 100 formed through process 960 through the CNC process.

According to an embodiment, process 970 may correspond to the last process of forming the housing 110 of the electronic device 100, but is not limited thereto. For example, the process of forming the housing 110 may further include a process of dying the outer surface of the housing 110 and/or a process of applying a functional layer on the housing 110.

Figure 11:
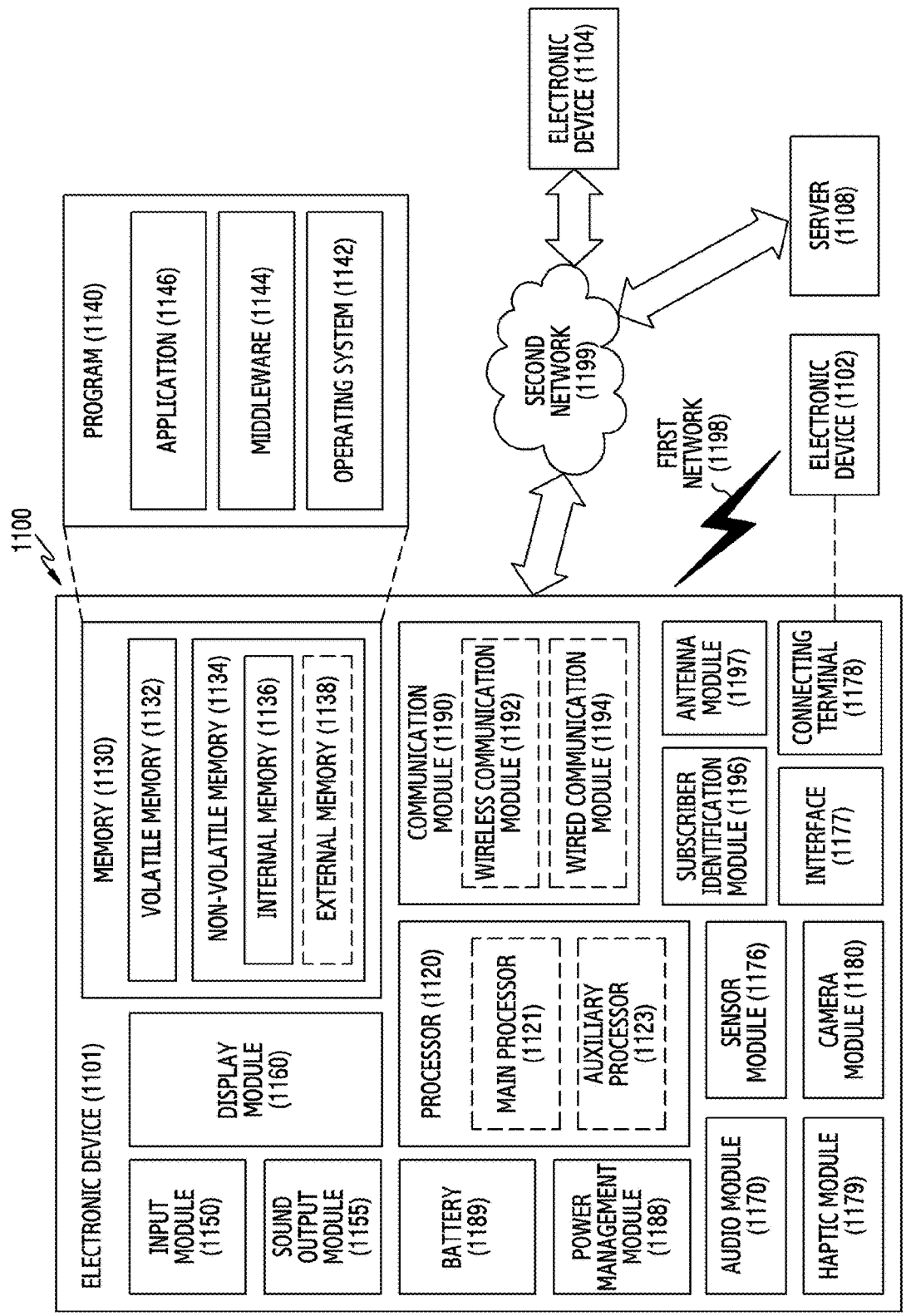
FIG. 11 is a block diagram illustrating an example electronic device in a network environment according to various embodiments.

FIG. 11 is a block diagram illustrating an example electronic device 1101 in a network environment 1100 according to various embodiments. Referring to FIG. 11, the electronic device 1101 in the network environment 1100 may communicate with an electronic device 1102 via a first network 1198 (e.g., a short-range wireless communication network), or at least one of an electronic device 1104 or a server 1108 via a second network 1199 (e.g., a long-range wireless communication network). According to an embodiment, the electronic device 1101 may communicate with the electronic device 1104 via the server 1108. According to an embodiment, the electronic device 1101 may include a processor 1120, memory 1130, an input module 1150, a sound output module 1155, a display module 1160, an audio module 1170, a sensor module 1176, an interface 1177, a connecting terminal 1178, a haptic module 1179, a camera module 1180, a power management module 1188, a battery 1189, a communication module 1190, a subscriber identification module (SIM) 1196, or an antenna module 1197. In various embodiments, at least one of the components (e.g., the connecting terminal 1178) may be omitted from the electronic device 1101, or one or more other components may be added in the electronic device 1101. In various embodiments, some of the components (e.g., the sensor module 1176, the camera module 1180, or the antenna module 1197) may be implemented as a single component (e.g., the display module 1160).

The processor 1120 may execute, for example, software (e.g., a program 1140) to control at least one other component (e.g., a hardware or software component) of the electronic device 1101 coupled with the processor 1120, and may perform various data processing or computation. According to an embodiment, as at least part of the data processing or computation, the processor 1120 may store a command or data received from another component (e.g., the sensor module 1176 or the communication module 1190) in volatile memory 1132, process the command or the data stored in the volatile memory 1132, and store resulting data in non-volatile memory 1134. According to an embodiment, the processor 1120 may include a main processor 1121 (e.g., a central processing unit (CPU) or an application processor (AP)), or an auxiliary processor 1123 (e.g., a graphics processing unit (GPU), a neural processing unit (NPU), an image signal processor (ISP), a sensor hub processor, or a communication processor (CP)) that is operable independently from, or in conjunction with, the main processor 1121. For example, when the electronic device 1101 includes the main processor 1121 and the auxiliary processor 1123, the auxiliary processor 1123 may be adapted to consume less power than the main processor 1121, or to be specific to a specified function. The auxiliary processor 1123 may be implemented as separate from, or as part of the main processor 1121.

The auxiliary processor 1123 may control at least some of functions or states related to at least one component (e.g., the display module 1160, the sensor module 1176, or the communication module 1190) among the components of the electronic device 1101, instead of the main processor 1121 while the main processor 1121 is in an inactive (e.g., sleep) state, or together with the main processor 1121 while the main processor 1121 is in an active state (e.g., executing an application). According to an embodiment, the auxiliary processor 1123 (e.g., an image signal processor or a communication processor) may be implemented as part of another component (e.g., the camera module 1180 or the communication module 1190) functionally related to the auxiliary processor 1123. According to an embodiment, the auxiliary processor 1123 (e.g., the neural processing unit) may include a hardware structure specified for artificial intelligence model processing. An artificial intelligence model may be generated by machine learning. Such learning may be performed, e.g., by the electronic device 1101 where the artificial intelligence is performed or via a separate server (e.g., the server 1108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 1130 may store various data used by at least one component (e.g., the processor 1120 or the sensor module 1176) of the electronic device 1101. The various data may include, for example, software (e.g., the program 1140) and input data or output data for a command related thereto. The memory 1130 may include the volatile memory 1132 or the non-volatile memory 1134.

The program 1140 may be stored in the memory 1130 as software, and may include, for example, an operating system (OS) 1142, middleware 1144, or an application 1146.

The input module 1150 may receive a command or data to be used by another component (e.g., the processor 1120) of the electronic device 1101, from the outside (e.g., a user) of the electronic device 1101. The input module 1150 may include, for example, a microphone, a mouse, a keyboard, a key (e.g., a button), or a digital pen (e.g., a stylus pen).

The sound output module 1155 may output sound signals to the outside of the electronic device 1101. The sound output module 1155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 1160 may visually provide information to the outside (e.g., a user) of the electronic device 1101. The display module 1160 may include, for example, a display, a hologram device, or a projector and control circuitry to control a corresponding one of the display, hologram device, and projector. According to an embodiment, the display module 1160 may include a touch sensor adapted to detect a touch, or a pressure sensor adapted to measure the intensity of force incurred by the touch.

The audio module 1170 may convert a sound into an electrical signal and vice versa. According to an embodiment, the audio module 1170 may obtain the sound via the input module 1150, or output the sound via the sound output module 1155 or a headphone of an external electronic device (e.g., an electronic device 1102) directly (e.g., wiredly) or wirelessly coupled with the electronic device 1101.

The sensor module 1176 may detect an operational state (e.g., power or temperature) of the electronic device 1101 or an environmental state (e.g., a state of a user) external to the electronic device 1101, and then generate an electrical signal or data value corresponding to the detected state. According to an embodiment, the sensor module 1176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1177 may support one or more specified protocols to be used for the electronic device 1101 to be coupled with the external electronic device (e.g., the electronic device 1102) directly (e.g., wiredly) or wirelessly. According to an embodiment, the interface 1177 may include, for example, a high definition multimedia interface (HDMI), a universal serial bus (USB) interface, a secure digital (SD) card interface, or an audio interface.

A connecting terminal 1178 may include a connector via which the electronic device 1101 may be physically connected with the external electronic device (e.g., the electronic device 1102). According to an embodiment, the connecting terminal 1178 may include, for example, a HDMI connector, a USB connector, a SD card connector, or an audio connector (e.g., a headphone connector).

The haptic module 1179 may convert an electrical signal into a mechanical stimulus (e.g., a vibration or a movement) or electrical stimulus which may be recognized by a user via his tactile sensation or kinesthetic sensation. According to an embodiment, the haptic module 1179 may include, for example, a motor, a piezoelectric element, or an electric stimulator.

The camera module 1180 may capture a still image or moving images. According to an embodiment, the camera module 1180 may include one or more lenses, image sensors, image signal processors, or flashes.

The power management module 1188 may manage power supplied to the electronic device 1101. According to an embodiment, the power management module 1188 may be implemented as at least part of, for example, a power management integrated circuit (PMIC).

The battery 1189 may supply power to at least one component of the electronic device 1101. According to an embodiment, the battery 1189 may include, for example, a primary cell which is not rechargeable, a secondary cell which is rechargeable, or a fuel cell.

The communication module 1190 may support establishing a direct (e.g., wired) communication channel or a wireless communication channel between the electronic device 1101 and the external electronic device (e.g., the electronic device 1102, the electronic device 1104, or the server 1108) and performing communication via the established communication channel. The communication module 1190 may include one or more communication processors that are operable independently from the processor 1120 (e.g., the application processor (AP)) and supports a direct (e.g., wired) communication or a wireless communication. According to an embodiment, the communication module 1190 may include a wireless communication module 1192 (e.g., a cellular communication module, a short-range wireless communication module, or a global navigation satellite system (GNSS) communication module) or a wired communication module 1194 (e.g., a local area network (LAN) communication module or a power line communication (PLC) module). A corresponding one of these communication modules may communicate with the external electronic device via the first network 1198 (e.g., a short-range communication network, such as Bluetooth™, wireless-fidelity (Wi-Fi) direct, or infrared data association (IrDA)) or the second network 1199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1192 may identify and authenticate the electronic device 1101 in a communication network, such as the first network 1198 or the second network 1199, using subscriber information (e.g., international mobile subscriber identity (IMSI)) stored in the subscriber identification module 1196.

The wireless communication module 1192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 1192 may support a high-frequency band (e.g., the mmWave band) to achieve, e.g., a high data transmission rate. The wireless communication module 1192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 1192 may support various requirements specified in the electronic device 1101, an external electronic device (e.g., the electronic device 1104), or a network system (e.g., the second network 1199). According to an embodiment, the wireless communication module 1192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 1197 may transmit or receive a signal or power to or from the outside (e.g., the external electronic device) of the electronic device 1101. According to an embodiment, the antenna module 1197 may include an antenna including a radiating element including a conductive material or a conductive pattern formed in or on a substrate (e.g., a printed circuit board (PCB)). According to an embodiment, the antenna module 1197 may include a plurality of antennas (e.g., array antennas). In such a case, at least one antenna appropriate for a communication scheme used in the communication network, such as the first network 1198 or the second network 1199, may be selected, for example, by the communication module 1190 (e.g., the wireless communication module 1192) from the plurality of antennas. The signal or the power may then be transmitted or received between the communication module 1190 and the external electronic device via the selected at least one antenna. According to an embodiment, another component (e.g., a radio frequency integrated circuit (RFIC)) other than the radiating element may be additionally formed as part of the antenna module 1197.

According to various embodiments, the antenna module 1197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1101 and the external electronic device 1104 via the server 1108 coupled with the second network 1199. Each of the electronic devices 1102 or 1104 may be a device of a same type as, or a different type, from the electronic device 1101.

According to an embodiment, all or some of operations to be executed at the electronic device 1101 may be executed at one or more of the external electronic devices 1102, 1104, or 1108. For example, if the electronic device 1101 should perform a function or a service automatically, or in response to a request from a user or another device, the electronic device 1101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1101. The electronic device 1101 may provide the outcome, with or without further processing of the outcome, as at least part of a reply to the request. To that end, a cloud computing, distributed computing, mobile edge computing (MEC), or client-server computing technology may be used, for example. The electronic device 1101 may provide ultra low-latency services using, e.g., distributed computing or mobile edge computing. In an embodiment, the external electronic device 1104 may include an internet-of-things (IoT) device. The server 1108 may be an intelligent server using machine learning and/or a neural network. According to an embodiment, the external electronic device 1104 or the server 1108 may be included in the second network 1199. The electronic device 1101 may be applied to intelligent services (e.g., smart home, smart city, smart car, or healthcare) based on 5G communication technology or IoT-related technology.

According to various example embodiments, an electronic device may include: a housing comprising: an outer portion defining at least a portion of an exterior of the electronic device and comprising a first conductive material, an inner portion comprising a second conductive material different from the first conductive material and having a first melting point, and at least partially defining a space for receiving multiple electronic components arranged inside the electronic device, and a middle portion comprising a third conductive material having a second melting point and an injection molded insulator, wherein the third conductive material of the middle portion and the first conductive material of the outer member are coupled to form a concave-convex structure, a difference between the first melting point and the second melting point being a value within a first range, and the third conductive material of the middle portion being electrically connected to the second conductive material of the inner portion.

According to an example embodiment, the middle portion and the inner portion may be made by a diecasting method.

According to an example embodiment, an interface between the inner portion and the middle portion may be slanted while having a specified angle with reference to a first axis facing the front surface of the electronic device.

According to an example embodiment, the specified angle may be in a range of −10 degrees to 10 degrees.

According to various example embodiments, an electronic device may include: a housing comprising: an outer portion defining at least a portion of an exterior of the electronic device and comprising titanium, an inner portion comprising magnesium and/or aluminum and at least partially defining a space for receiving multiple electronic components arranged inside the electronic device, and a middle portion comprising magnesium and/or aluminum and an injection molded insulator, wherein a portion of the middle portion is coupled to the outer portion to form a concave-convex structure, and another portion of the middle portion is electrically connected to the inner member.

According to various example embodiments, an electronic device may include: a housing comprising: an outer portion defining at least a portion of an exterior of the electronic device and comprising a first conductive material, an inner portion comprising a second material different from the first conductive material and having a first melting point, and at least partially defining a space for receiving multiple electronic components arranged inside the electronic device, and a middle portion comprising a third conductive material having a second melting point and an injection molded insulator, wherein the third conductive material of the middle portion and the first conductive material of the outer portion are coupled to form a concave-convex structure, the third conductive material of the middle portion being electrically connected to a portion of the inner portion, a difference between the first melting point and the second melting point having a value within a first range, and the middle portion and the inner portion are made by a diecasting method.

According to an example embodiment, the first conductive material of the outer portion may have a first specific gravity, the second conductive material of the inner portion may have a second specific gravity, wherein the first specific gravity may be greater than the second specific gravity.

According to an example embodiment, the first conductive material may comprise titanium and the second conductive material may comprise magnesium and/or aluminum.

According to an example embodiment, the third conductive material of the middle portion may comprise magnesium and/or aluminum.

According to an example embodiment, an interface between the inner portion and the middle portion may be slanted while having a specified angle with reference to a first axis facing the front surface of the electronic device.

According to an example embodiment, the specified angle be in a range of −10 degrees to 10 degrees.

According to an example embodiment, the insulator of the middle portion comprise a mixture of a thermoplastic resin and inorganic compounds.

According to an example embodiment, the second conductive material of the inner portion and the third conductive material of the middle portion, which is connected to the second conductive material at a first point may be electrically connected to a ground of a printed circuit board (PCB) disposed inside the electronic device.

According to an example embodiment, the PCB of the electronic device may include: a wireless communication circuit, the third conductive material of the middle portion may be electrically connected to the PCB, and the wireless communication circuit may be configured to transmit and/or receive a signal in a designated frequency, based on an electrical path including the third conductive material and the second conductive material, by feeding a second point of the third conductive material electrically connected to the PCB.

According to an example embodiment, the middle portion and the inner portion may be made by a diecasting method.

According to an example embodiment, at least a portion of the inner portion may be configured by a sheet by a press method.

According to example an embodiment, the third conductive material and the second conductive material may be electrically connected to each other by welding.

According to an example embodiment, the insulator of the middle portion may be exposed outside the electronic device to at least partially define the exterior of the electronic device together with the outer portion.

According to an example embodiment, the first range of the difference of the first melting point and the second melting point may be within 11° C.

According to an example embodiment, the first melting point of the second conductive material and the second melting point of the third conductive material within the first range may have substantially the same melting point.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1140) including one or more instructions that are stored in a storage medium (e.g., internal memory 1136 or external memory 1138) that is readable by a machine (e.g., the electronic device 1101). For example, a processor (e.g., the processor 1120) of the machine (e.g., the electronic device 1101) may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a housing comprising: an outer portion defining at least a portion of an exterior of the electronic device and comprising titanium;
    an inner portion comprising magnesium and/or aluminum and at least partially defining a space for receiving multiple electronic components arranged inside the electronic device; and
    a middle portion comprising magnesium and/or aluminum and an injection molded insulator,
    wherein a portion of the middle portion is coupled to the outer portion forming a concave-convex structure, and another portion of the middle portion is electrically connected to the inner portion.

2. The electronic device of claim 1, wherein the middle portion and the inner portion are diecast.

3. The electronic device of claim 1, wherein an interface between the inner portion and the middle portion is slanted at a specified angle with reference to a first axis facing a front surface of the electronic device.

4. The electronic device of claim 3, wherein the specified angle is in a range of −10 degrees and 10 degrees.

5. An electronic device comprising:
    an outer portion defining at least a portion of an exterior of the electronic device and comprising a first conductive material;
    an inner portion comprising a second material different from the first conductive material and having a first melting point, and at least partially defining a space for receiving multiple electronic components arranged inside the electronic device; and
    a middle portion comprising a third conductive material having a second melting point and an injection molded insulator,
    wherein the third conductive material of the middle portion and the first conductive material of the outer portion are coupled to form a concave-convex structure,
    a difference between the first melting point and the second melting point being a value within a first range,
    the third conductive material of the middle portion being electrically connected to a portion of the inner portion, and
    the middle portion and a portion of the inner portion are diecast.

6. An electronic device comprising a housing comprising:
    an outer portion defining at least a portion of an exterior of the electronic device and comprising a first conductive material;
    an inner portion comprising a second conductive material different from the first conductive material and having a first melting point, and at least partially defining a space for receiving multiple electronic components arranged inside the electronic device; and
    a middle portion comprising a third conductive material having a second melting point and an injection molded insulator,
    wherein the third conductive material of the middle portion and the first conductive material of the outer portion have a concave-convex structure,
    a difference between the first melting point and the second melting point has a value within a first range, and
    the third conductive material of the middle portion is electrically connected to the second conductive material of the inner portion.

7. The electronic device of claim 6, wherein the first conductive material of the outer portion has a first specific gravity, and the second conductive material of the inner portion has a second specific gravity, and
    the first specific gravity is greater than the second specific gravity.

8. The electronic device of claim 7, wherein the first conductive material comprises titanium, and
    the second conductive material comprises magnesium and/or aluminum.

9. The electronic device of claim 8, wherein the third conductive material of the middle portion comprises magnesium and/or aluminum.

10. The electronic device of claim 6, wherein an interface between the inner portion and the middle portion is slanted at a specified angle with reference to a first axis facing a front surface of the electronic device.

11. The electronic device of claim 10, wherein the specified angle is in a range of −10 degrees and 10 degrees.

12. The electronic device of claim 6, wherein the insulator of the middle portion comprises a mixture of a thermoplastic resin and inorganic compounds.

13. The electronic device of claim 6, wherein the second conductive material of the inner portion and the third conductive material of the middle portion connected to the second conductive material at a first point are electrically connected to a ground of a printed circuit board (PCB) disposed inside the electronic device.

14. The electronic device of claim 6, wherein the electronic device comprises a wireless communication circuit disposed on a PCB, the third conductive material of the middle portion is electrically connected to the PCB, and the wireless communication circuit is configured to transmit and/or receive a signal in a designated frequency, based on an electrical path comprising the third conductive material and the second conductive material, by feeding a second point of the third conductive material electrically connected to the PCB.

15. The electronic device of claim 6, wherein the middle portion and the inner portion are diecast.

16. The electronic device of claim 6, wherein at least a portion of the inner portion comprises a pressed sheet.

17. The electronic device of claim 6, wherein the third conductive material and the second conductive material are electrically connected to each other by welding.

18. The electronic device of claim 6, wherein the insulator of the middle portion is exposed outside the electronic device to at least partially define the exterior of the electronic device together with the outer portion.

19. The electronic device of claim 6, wherein the first range of the difference of the first melting point and the second melting point is within 11° C.

20. The electronic device of claim 6, wherein the first melting point of the second conductive material and the second melting point of the third conductive material within the first range have substantially the same melting point.

* * * * *